US008842441B2

(12) United States Patent
Bai et al.

(10) Patent No.: US 8,842,441 B2
(45) Date of Patent: Sep. 23, 2014

(54) ELECTRONIC DEVICE, ELECTRONIC SYSTEM, AND CIRCUIT BOARD INTERCONNECTION ARCHITECTURE OF THE SAME

(71) Applicant: Huawei Technologies Co., Ltd., Guangdong (CN)

(72) Inventors: Lei Bai, Shenzhen (CN); Xiongbiao Liu, Shenzhen (CN); Lexiong Peng, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/103,085

(22) Filed: Dec. 11, 2013

(65) Prior Publication Data

US 2014/0220795 A1  Aug. 7, 2014

Related U.S. Application Data

(63) Continuation of application No. PCT/CN2013/080965, filed on Aug. 7, 2013.

(30) Foreign Application Priority Data

Feb. 5, 2013  (CN) .......................... 2013 1 0046147

(51) Int. Cl.
  *H05K 7/00* (2006.01)
  *H05K 1/11* (2006.01)
  *H05K 1/14* (2006.01)
  *H01R 12/73* (2011.01)

(52) U.S. Cl.
  CPC .................................. *H01R 12/737* (2013.01)
  USPC .......................................... 361/785; 361/728

(58) Field of Classification Search
  CPC .... H01R 12/52; H01R 12/714; H01R 12/718; H01R 12/721; H01R 12/728
  USPC .............. 361/785, 724, 727, 728; 439/60–62, 439/924.1
  See application file for complete search history.

(56) References Cited

U.S. PATENT DOCUMENTS

| 2,951,184 | A  | * | 8/1960  | Wyma ........................... 361/788 |
| 5,911,596 | A  | * | 6/1999  | Antonuccio et al. .......... 439/493 |
| 6,083,046 | A  |   | 7/2000  | Wu et al. |
| 6,496,376 | B1 | * | 12/2002 | Plunkett et al. ............... 361/729 |
| 6,918,775 | B2 | * | 7/2005  | Korsunsky et al. ............. 439/65 |

(Continued)

FOREIGN PATENT DOCUMENTS

| CN | 2454935 Y    | 10/2001 |
| CN | 201515556 U  | 6/2010  |
| CN | 201976344 U  | 9/2011  |

*Primary Examiner* — Yuriy Semenenko

(57) ABSTRACT

The present invention discloses a circuit board interconnection architecture, which includes at least one first plugboard and at least two second plugboards substantially perpendicular to the first plugboard, where at least one of the first plugboard and the second plugboards is provided with several slots; the first plugboard and the second plugboards are mated and electrically connected by using signal connectors on both sides of the slots. The circuit board interconnection architecture solves a fitting precision problem of the first plugboard and the second plugboards in orthogonal directions. Even though there is an assembly tolerance between the first plugboard and the second plugboards, the connectors still satisfy assembly precision requirements, which can also avoid overall deformation of a first circuit board and a second circuit board after the first plugboard and the second plugboards are interconnected and mated orthogonally.

15 Claims, 4 Drawing Sheets

(56) References Cited

U.S. PATENT DOCUMENTS

| | | |
|---|---|---|
| 8,345,439 B1 * | 1/2013 | Goergen et al. ............... 361/788 |
| 2002/0071255 A1 | 6/2002 | Centola et al. |
| 2002/0071260 A1 | 6/2002 | Centola et al. |
| 2002/0181194 A1 * | 12/2002 | Ho et al. ....................... 361/684 |
| 2007/0184676 A1 * | 8/2007 | Minich ........................... 439/65 |

* cited by examiner

ELECTRONIC DEVICE, ELECTRONIC SYSTEM, AND CIRCUIT BOARD INTERCONNECTION ARCHITECTURE OF THE SAME

CROSS-REFERENCE TO RELATED APPLICATIONS

This application is a continuation of International Application No. PCT/CN2013/080965, filed on Aug. 7, 2013, which claims priority to Chinese Patent Application No. 201310046147.X, filed on Feb. 5, 2013, both of which are hereby incorporated by reference in their entireties.

TECHNICAL FIELD

The present invention relates to the field of electronic circuits, and in particular, to an electronic device, an electronic system, and a circuit board interconnection architecture of the same.

BACKGROUND

At present, an electronic system of an electronic device, such as a server, a router, or a switch, generally is an integrated circuit having specific functions and consisting of several basic circuits that are interconnected and interact with each other. Functional circuits therein are mostly deployed and integrated on circuit boards, where a connector is used between circuit boards to implement an electrical connection between the functional circuits. Circuit boards of existing electronic devices mostly use an arrangement mode of an orthogonal architecture. That is, connectors on a front circuit board and a rear circuit board of an electronic system are directly mated perpendicularly in an orthogonal manner, so as to implement an electrical connection between the functional circuits on the circuit boards.

As the aforesaid electronic devices are developing toward higher and higher density, more and more circuit boards thereof are integrated, and connectors on the front circuit board and the rear circuit board are getting closer and closer, and the arrangement density is getting higher and higher. As a result, when the front circuit board and the rear circuit board are mated directly, there is a larger assembly tolerance therebetween. Furthermore, an accumulated tolerance chain may exceed that required for fitting precision of the connectors, so that the circuit boards assembled with connectors are deformed after being mated and assembled. In addition, the connectors are closer to each other, and a larger external force needs to be applied thereon during installation to assemble them onto the circuit boards.

SUMMARY

A technical problem to be solved by embodiments of the present invention is to provide a circuit board interconnection architecture which has high installation and fitting precision and is convenient for mating.

In addition, the embodiments of the present invention further provide an electronic system which uses the circuit board interconnection architecture.

In addition, the embodiments of the present invention further provide an electronic device which uses the electronic system.

A circuit board interconnection architecture includes at least one first plugboard and at least two second plugboards that are substantially perpendicular to the first plugboard, where at least one of the first plugboard and the second plugboards is provided with several slots; and the first plugboard and the second plugboards are mated and electrically connected by using signal connectors provided on both sides of the slots.

An electronic system includes at least one first plugboard, at least two second plugboards, several first signal connectors, and several second signal connectors, where the first plugboard is substantially perpendicular to the second plugboards; the first signal connectors are set on the first plugboard; the second signal connectors are set on the second plugboards; at least one of the first plugboard and the second plugboards is provided with several slots; the slots are located between any two adjacent first signal connectors or between any two adjacent second signal connectors, or the slots are located between any two adjacent first signal connectors and the slots are located between any two adjacent second signal connectors; and the first plugboard and the second plugboards are mated and connected by using the first signal connectors and the second signal connectors.

An electronic device includes a housing and the aforesaid electronic system that is set in the housing.

According to the above description, by providing the slots on the first plugboard and the second plugboards, when the first plugboard is perpendicularly mated with and connected to the second plugboards by using the connectors, the connectors on the first circuit board and the second circuit board may move in two directions perpendicular to the first circuit board and the second circuit board, which solves a fitting precision problem of the first plugboard and the second plugboards in orthogonal directions. Even though there is an assembly tolerance between the first plugboard and the second plugboards, the connectors still satisfy assembly precision requirements, which can also avoid overall deformation of the first circuit board and the second circuit board after the first plugboard and the second plugboards are interconnected and mated orthogonally.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
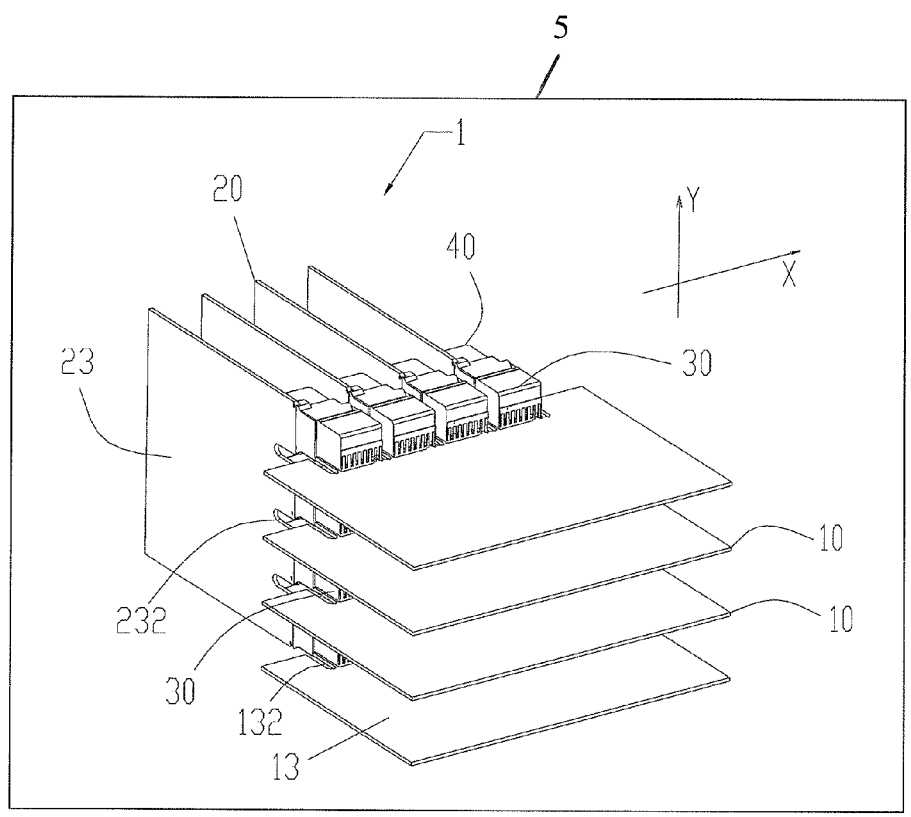
FIG. 1 is a schematic assembly diagram of a circuit board interconnection architecture of an electronic system according to an exemplary embodiment of the present invention.
Figure 2:
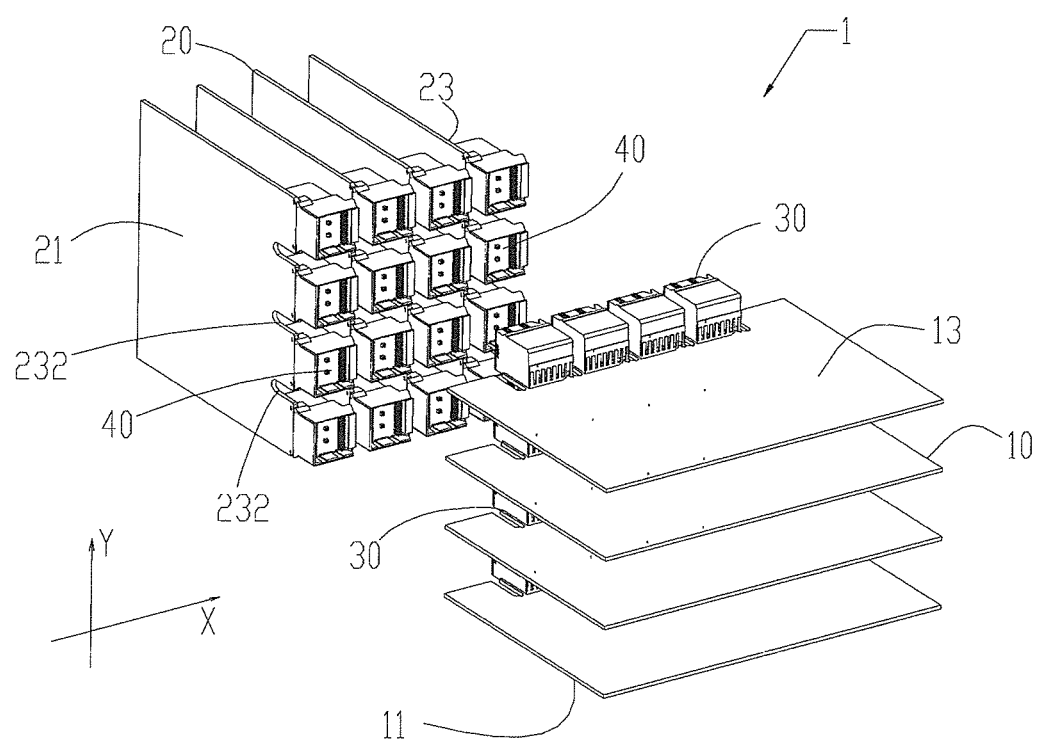
FIG. 2 is schematic exploded view of a circuit board interconnection architecture of an electronic system shown in FIG. 1.

Referring to FIG. 1 and FIG. 2, an electronic system 1 according to an exemplary embodiment of the present invention is applicable to an electronic device such as a server, a router, or a switch (not shown in the figure), and may be packaged inside a housing 5 of the electronic device as an integrated circuit having specific functions. The electronic system 1 includes at least one first plugboard 10, at least two second plugboards 20, several first signal connectors 30 provided on the first plugboard 10, and several second signal connectors 40 provided on the second plugboards 20. The embodiment of the present invention is described by using an example where the electronic system 1 includes four parallel first plugboards 10 and four parallel second plugboards 20, and the four first plugboards 10 are perpendicular to the four second plugboards 20.

The first signal connectors 30 are electrically connected to the first plugboard 10, the second signal connectors 40 are electrically connected to the second plugboards, and the first signal connectors 30 may be mated with and connected to corresponding second signal connectors 40, so as to implement an orthogonal architecture assembly connection between the first plugboards 10 and the second plugboards 20. The embodiment of the present invention is described by using an example where each first plugboard 10 is installed with four first signal connectors 30, and each second plugboard 20 is installed with four second signal connectors 40. The first signal connectors 30 and the second signal connectors 40 are provided on the first plugboards 10 and the second plugboards 20 substantially in a shape of a matrix as a whole, and installation positions of the first signal connectors 30 one-to-one correspond to installation positions of corresponding second signal connectors 40, so that the first signal connectors 30 and the second signal connectors 40 may be mated and connected.

Figure 4A:
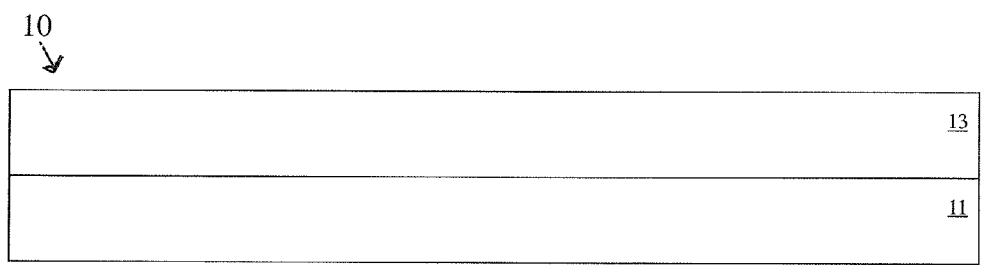
FIG. 4A is a side view of a first plugboard shown in FIG. 1.

Referring to FIG. 4A, each first plugboard 10 includes a first base board 11 and a first circuit board 13, where the first circuit board 13 is provided on the first base board 11, and the first base board 11 supports the first circuit board 13. In the embodiment of the present invention, the first base board 11 may be made of a metal material such as copper or iron.

Figure 3:
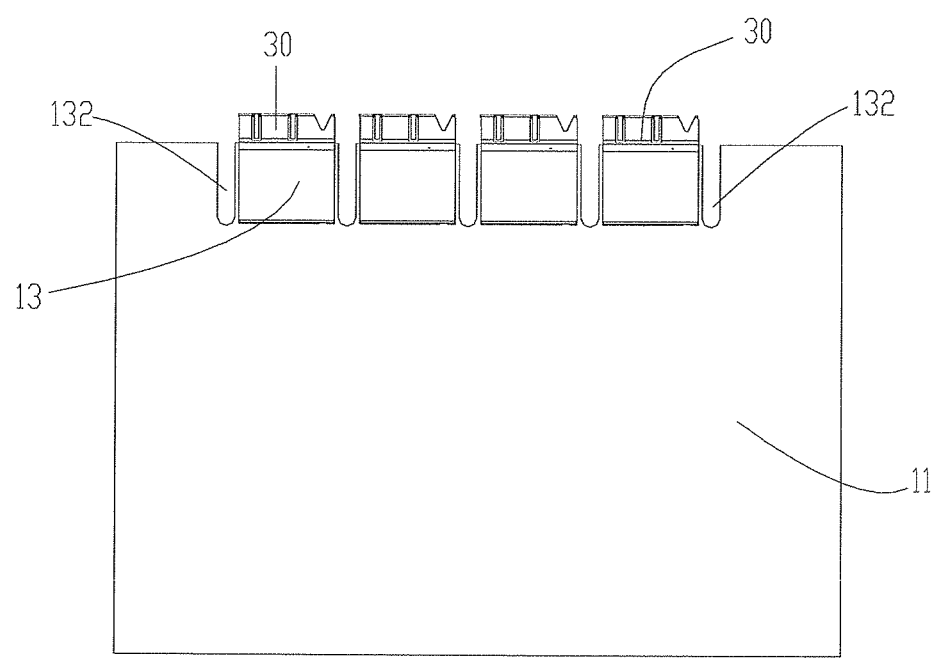
FIG. 3 is a schematic diagram of a connection between a first plugboard and first signal connectors shown in FIG. 2.

Referring to FIG. 3 together, the first circuit board 13 is a support body for electronic components such as an integrated circuit, a connector, an electromechanical component, and a sensor, and provides an electrical connection between the electronic components. In the embodiment of the present invention, the first circuit board 13 may be a printed circuit board (printed circuit board, PCB). An edge of the first circuit board 13 is provided with several slots 132, where the slots 132 are arranged on the edge of the first circuit board 13 with equal distances. In the embodiment of the present invention, each slot 132 may be a rectangular slot, where a width thereof may be 1 mm or 2 mm, and a length thereof is 15 mm.

In another embodiment, any two adjacent slots 132 may also be arranged on the edge of the first circuit board 13 with unequal distances therebetween, for example, be arranged with descending distances or ascending distances, or the arrangement mode of the slots 132 may be arranged according to installation and design positions of the first signal connectors 30.

In another embodiment, the slots 132 are not limited to rectangular slots, and may also be triangle slots, semi-elliptical slots, semi-circular slots, or slots of other shapes.

Specifically, the first signal connectors 30 are provided on the edge of the first circuit board 13 of the first plugboard 10, and are electrically connected to the first circuit board 13. The slots 132 are provided between any two adjacent first signal connectors 30. In other words, the first signal connectors 30 are provided on both sides of each slot 132 of the first circuit board 13.

Figure 4B:
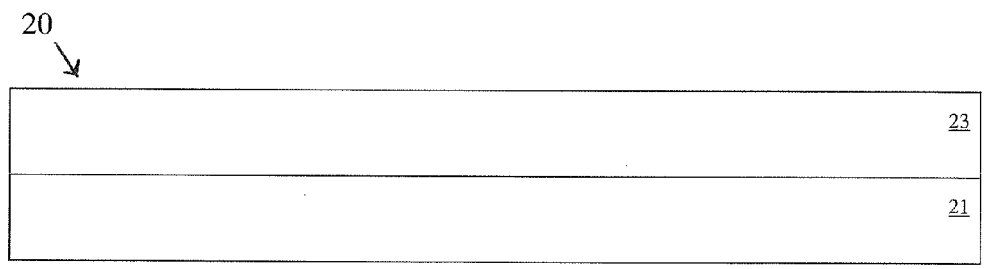
FIG. 4B is a side view of a second plugboard shown in FIG. 1.

Referring to FIG. 4B, each second plugboard 20 includes a second base board 21 and a second circuit board 23, where the second circuit board 23 is provided on the second base board 21, and the second base board 21 supports the second circuit board 23. In the embodiment of the present invention, the second base board 21 may be made of a metal material such as copper and iron.

The second circuit board 23 is a support body for electronic components such as an integrated circuit, a connector, an electromechanical component, and a sensor, and provides an electrical connection between the electronic components. In the embodiment of the present invention, the second circuit board 23 may also be a printed circuit board. An edge of the second circuit board 23 is provided with several slots 232, where the slots 232 are arranged on the edge of the second circuit board 23 with equal distances. In the embodiment of the present invention, each slot 232 may be a rectangular slot, where a width thereof may be 1 mm or 2 mm, and a length thereof is 15 mm.

In another embodiment, any two adjacent slots 232 may also be arranged on the edge of the second circuit board 23 with unequal distances therebetween, for example, be arranged with descending distances or ascending distances, or the arrangement mode of the slots 232 may be provided according to installation and design positions of the second signal connectors 30.

In another embodiment, the slots 232 are not limited to rectangular slots, and may also be triangle slots, semi-elliptical slots, semi-circular slots, or slots of other shapes. It should be understood that specific shapes and sizes of the slots may also be correspondingly adjusted according to actual requirements.

In the embodiment of the present invention, the slots 132 may also be formed by cutting the edge of the first base board 11, so that the edge of the first plugboard 10 is cut through to form the slots of the shapes described above. Similarly, the slots 132 may also be formed by cutting the edge of the second base board 21, so that the edge of the second plugboard 20 is cut through to form the slots of the shapes described above.

Specifically, the second signal connectors 40 are provided on the edge of the second circuit board 23 of the second plugboard 20, and are electrically connected to the second circuit board 23. The slots 232 are provided between any two adjacent second signal connectors 40. In other words, the second signal connectors 40 are provided on both sides of each slot 232 of the second circuit board 23.

In the embodiment of the present invention, the first signal connectors 30 may be directly mated with and connected to corresponding second signal connectors 40, so as to implement the electrical connection between the first plugboards 10 and the second plugboards 20, thereby implementing current or signal transmission between the first circuit board 13 and the second circuit board 23. In such a case, the first plugboards 10 and the second plugboards 20 are connected perpendicularly, so as to form an orthogonal interconnection architecture between the first plugboards 10 and the second plugboards 20. In the embodiment of the present invention, specifically, it may be set that a direction parallel to a plane where each first plugboard 10 is located is an X-axis direction, and correspondingly, a direction parallel to a plane where each second plugboard 20 is located is a Y-axis direction orthogonal to the X-axis direction.

Indeed, it may be understood that the direction parallel to the plane where each first plugboard 10 is located may be set as a Y-axis direction, and the direction parallel to the plane where each second plugboard 20 is located may be correspondingly set as an X-axis direction.

Referring to FIG. 1 to FIG. 3 together, assembling the first plugboards 10 and the second plugboards 20 is described by using an example where the first plugboards 10 are located in the X-axis direction and the second plugboards 20 are located in the Y-axis direction orthogonal to the X-axis direction. The first signal connectors 30 are provided on the first circuit boards 13, the slots 132 are provided between any two adjacent first signal connectors 30, the second signal connectors 30 are provided on the second circuit board 23, and the slots 232 are provided between any two adjacent second signal connectors 40. The first connectors 30 are one-to-one aligned to the second connectors 40, and may be one-to-one connected and fitted to the corresponding second connectors 40. That is, the first signal connectors 30 arranged along the X-axis direction on the first circuit board 13 are one-to-one mated with and connected to the second signal connectors 40 arranged along the Y-axis direction on the second circuit board 23.

Because the slot 132 is provided between any two adjacent first signal connectors 30 of each first plugboard 10, and the slot 232 is provided between any two adjacent second signal connectors 40 of each second plugboard 20. In such a case, in order to satisfy connector fitting precision requirements, an area of the first circuit board 13 between two adjacent slots 132 deviates in a positive direction or a negative direction along the Y axis (that is, in a direction perpendicular to a surface of the first circuit board 13). That is, the first connector 30 between the two adjacent slots 132 also moves in the positive direction or the negative direction along the Y axis. Meanwhile, an area of the second circuit board 13 between two adjacent slots 232 deviates in a positive direction or a negative direction along the X axis (that is, in a direction perpendicular to a surface of the second circuit board 23). That is, the second connector 40 between the two adjacent slots 232 also moves in the positive direction or the negative direction of the X axis of the X axis. Therefore, by providing the slots between the connectors on the first plugboards 10 and the second plugboards 20 that are orthogonal to each other, the fitting precision problem of the first plugboards 10 and the second plugboards 20 in orthogonal directions is solved. Even though there is an assembly tolerance between the first plugboards 10 and the second plugboards 20, the connectors still can satisfy the assembly precision requirements, which may also avoid overall deformation of the front circuit boards 13 and the second circuit boards 23 after the first plugboards 10 and the second plugboards 20 are interconnected and mated orthogonally.

It may be understood that, in another embodiment, two or more than two slots may be provided between any two adjacent connectors on the first circuit boards 13 and the second circuit boards 23. As a result, after the first plugboards 10 and the second plugboards 20 are interconnected and mated orthogonally, the connectors on the first circuit boards 13 and the second circuit boards 23 all can move in directions perpendicular to the first circuit boards 13 and the second circuit boards 23, thereby solving the fitting precision problem of the first plugboards 10 and the second plugboards 20 in orthogonal directions. Even though there is an assembly tolerance between the first plugboards 10 and the second plugboards 20, the connectors still can satisfy assembly precision requirements, which can also avoid overall deformation of the first circuit boards 13 and the second circuit boards 23 after the first plugboards 10 and the second plugboards 20 are interconnected and mated orthogonally.

In another embodiment, several slots may be provided only on the first plugboards 10 or the second plugboards 20. That is, at least one of the first plugboards 10 and the second plugboards 20 is provided with several slots. In such a case, the slot is located between any two adjacent first signal connectors 30 or between any two adjacent second signal connectors 40, or the slot is located between any two adjacent first signal connectors 30 and located between any two adjacent second signal connectors 40. The first plugboards 10 and the second plugboards 20 are mated and connected by using the first signal connectors 30 and the second signal connectors 40. Therefore, the first signal connectors 30 deviate in a direction perpendicular to the first circuit boards 13 or the second signal connectors deviate in a direction perpendicular to the second circuit boards 23, or both the first signal connectors 30 and the second signal connectors 40 deviate respectively in the direction perpendicular to the first circuit boards 13 and that perpendicular to the second circuit boards 23.

It may be understood that in another embodiment, a non-orthogonal interconnection architecture may also be used between the first plugboards 10 and the second plugboards 20. That is, the first plugboards 10 and the second plugboards 20 are mated and connected by using signal connectors provided on both sides of the slot, where a plane where each first plugboard 10 is located intersects with a plane where each second plugboard 20 is located, and an angle therebetween is not 90 degree.

In another embodiment, a backplane structure (not shown in the figure) may be added between the first plugboards 10 and the second plugboards 20, where the first plugboards 10 and the second plugboards 20 form an interconnection architecture by using the backplane. Specifically, the first signal connectors 30 of the first plugboards 10 may one-to-one correspond to the second signal connectors 40 on the second plugboards 20, and the first plugboards 10 or the second plugboards 20 are provided with several slots; therefore, the first signal connectors 30 are directly mated with and connected to the second signal connectors 40. The first signal connectors 30 of the first plugboards 10 may not one-to-one correspond to the second signal connectors 40 on the second plugboards 20, and the first plugboard 10 or the second plugboard 20 areprovided several slots; therefore, the first signal connectors 30 and the second signal connectors 40 are provided on the backplane structure, and implement current or signal transmission between the first signal connectors 30 and the second signal connectors 40 by using internal wiring of the backplane structure.

According to the above description, by providing the slots on the first plugboards 10 and the second plugboards 20, when the first plugboards 10 are mated with and connected to the second plugboards 20 perpendicularly by using the connectors, the connectors on the first circuit boards 13 and the second circuit boards 23 can move in the two directions perpendicular to the first circuit boards 13 and the second circuit boards 23, which solves the fitting precision problem of the first plugboards 10 and the second plugboards 20 in orthogonal directions. Even though there is an assembly tolerance between the first plugboards 10 and the second plugboards 20, the connectors still can satisfy assembly precision requirements, which can also avoid overall deformation of the first circuit boards 13 and the second circuit boards 23 after the first plugboards 10 and the second plugboards 20 are interconnected and mated orthogonally.

The above are merely an exemplary embodiment of the present invention. However, the protection scope of the present invention is not limited thereto. Therefore, equivalent changes derived according to the claims of the present invention shall fall within the protection scope of the present invention.

What is claimed is:

1. A circuit board interconnection architecture, comprising:
    at least one first plugboard comprising first signal connectors that protrude from an edge of the first plugboard;
    at least two second plugboards that are substantially perpendicular to the at least one first plugboard, the at least two second plugboards comprising second signal connectors, wherein each of the second plugboards comprises at least one second signal connector that corresponds to a respective first signal connector and that protrudes from an edge of the second plugboard;
    wherein at least one of the at least one first plugboard and the at least two second plugboards is provided with several slots; and
    wherein the at least one first plugboard and the at least two second plugboards are mated and electrically connected by connecting the first signal connectors to the second signal connectors, wherein at least one signal connector of one of the first signal connectors and the second signal connectors is provided on each side of at least one of the slots.

2. The circuit board interconnection architecture according to claim 1, wherein:
    the at least one first plugboard comprises a first base board and a first circuit board;
    the first circuit board is provided on the first base board;
    the first circuit board is a support body for electronic components and provides an electrical connection between the electronic components; and
    the first base board supports the first circuit board.

3. The circuit board interconnection architecture according to claim 2, wherein:
    the at least two second plugboards each comprise a second base board and a second circuit board;
    the second circuit board is provided on the second base board;
    the second circuit board is a support body for electronic components and provides an electrical connection between the electronic components; and
    the second base board supports the second circuit board.

4. The circuit board interconnection architecture according to claim 3, wherein:
    each slot is provided on an edge of at least one of the first circuit board and the second circuit board and is located between any two adjacent signal connectors; and
    the first circuit board and the second circuit board perform current or signal transmission therebetween by using the first signal connectors and the second signal connectors that are mated and connected.

5. The circuit board interconnection architecture according to claim 1, wherein a shape of a cross section of the slot is any one of a rectangle, a triangle, a half ellipse, and a half circle.

6. An electronic system, comprising:
    at least one first plugboard;
    at least two second plugboards;
    several first signal connectors;
    several second signal connectors;
    wherein the at least one first plugboard is substantially perpendicular to the at least two second plugboards;
    wherein the first signal connectors are set on the at least one first plugboard and protrude from an edge of the first plugboard;
    wherein at least one of the second signal connectors is set on each of the at least two second plugboards, protrudes from a respective edge of each of the at least two second plugboards, and corresponds to a respective first signal connector;
    wherein at least one of the at least one first plugboard and the at least two second plugboards is provided with several slots, wherein at least one of the slots is located between two adjacent first signal connectors or between two adjacent second signal connectors, or wherein at least one of the slots is located between two adjacent first signal connectors and another one of the slots is located between two adjacent second signal connectors; and
    wherein the at least one first plugboard and the at least two second plugboards are mated and connected by connecting the first signal connectors to the second signal connectors.

7. The electronic system according to claim 6, wherein:
    the at least one first plugboard comprises a first base board and a first circuit board;
    the first circuit board is provided on the first base board;
    the first signal connectors are provided on an edge of the first circuit board of the at least one first plugboard and are electrically connected to the first circuit board; and
    the first base board supports the first circuit board.

8. The electronic system according to claim 7, wherein:
    the at least two second plugboards each comprise a second base board and a second circuit board;
    the second circuit board is provided on the second base board;
    the second signal connectors are provided on an edge of the second circuit board of the at least two second plugboards and are electrically connected to the second circuit board; and
    the second base board supports the second circuit board.

9. The electronic system according to claim 8, wherein:
    the slots are provided on an edge of at least one of the first circuit board and second circuit board;
    the first circuit board and the second circuit board perform current or signal transmission therebetween by using the first signal connectors and the second signal connectors that are mated and connected;
    the first plugboard and the second plugboard form an interconnection architecture; and
    one of the first signal connectors and the second signal connectors deviate in a direction perpendicular to a respective one of the first circuit board and the second circuit board, or the first signal connectors and the second signal connectors each deviate in a direction perpendicular to a respective one of the first circuit board and the second circuit board.

10. The electronic system according to claim 6, wherein the slot is any one of a rectangular slot, a triangle slot, a semicircular slot, and a semi-elliptical slot.

11. An electronic device, comprising:
    a housing; and
    an electronic system comprising,
        at least one first plugboard,
        at least two second plugboards,
        several first signal connectors,
        several second signal connectors, wherein the at least one first plugboard is substantially perpendicular to the at least two second plugboards, wherein the first signal connectors are set on the at least one first plugboard and protrude from an edge of the first plugboard;

wherein at least one of the second signal connectors is set on each of the at least two second plugboards, protrudes from a respective edge of each of the at least two second plugboards, and corresponds to a respective first signal connector;

wherein at least one of the at least one first plugboard and the at least two second plugboards is provided with several slots, wherein at least one of the slots is located between two adjacent first signal connectors or between two adjacent second signal connectors, or wherein at least one of the slots is located between two adjacent first signal connectors and another one of the slots is located between two adjacent second signal connectors; and the first plugboard and the at least two second plugboards are mated and connected by connecting the first signal connectors to the second signal connectors.

12. The electronic device according to claim 11, wherein:

the at least one first plugboard comprises a first base board and a first circuit board;

the first circuit board is provided on the first base board;

the first signal connectors are provided on an edge of the first circuit board of the at least one first plugboard and are electrically connected to the first circuit board; and the first base board supports the first circuit board.

13. The electronic device according to claim 12, wherein:

the at least two second plugboards each comprise a second base board and a second circuit board;

the second circuit board is provided on the second base board;

the second signal connectors are provided on an edge of the second circuit board of the second plugboard and are electrically connected to the second circuit board; and the second base board supports the second circuit board.

14. The electronic device according to claim 13, wherein:

the slots are provided on an edge of at least one of the first circuit board and the second circuit board;

the first circuit board and the second circuit board perform current or signal transmission therebetween by using the first signal connectors and the second signal connectors that are mated and connected;

the at least one first plugboard and the at least two second plugboards form an interconnection architecture; and one of the first signal connectors and the second signal connectors deviate in a direction perpendicular to a respective one of the first circuit board and the second circuit board, or the first signal connectors and the second signal connectors each deviate in a direction perpendicular to a respective one of the first circuit board and the second circuit board.

15. The electronic device according to claim 11, wherein the slot is any one of a rectangular slot, a triangle slot, a semi-circular slot, and a semi-elliptical slot.

* * * * *